United States Patent
Michiels et al.

(10) Patent No.: US 9,618,179 B2
(45) Date of Patent: Apr. 11, 2017

(54) OPTICAL CONFIGURATIONS WITH TWO OR MORE MICRO STRUCTURED FILMS

(71) Applicant: PHILIPS LIGHTING HOLDING B.V., Eindhoven (NL)

(72) Inventors: Wilhelmus Petrus Adrianus Johannus Michiels, Reusel (NL); Marcellinus Petrus Carolus Michael Krijn, Eindhoven (NL); Ruslan Akhmedovich Sepkhanov, Eindhoven (NL); Antonius Adrianus Maria Marinus, Eindhoven (NL); Hendrikus Hubertus Petrus Gommans, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/646,745

(22) PCT Filed: Oct. 13, 2014

(86) PCT No.: PCT/EP2014/071827
§ 371 (c)(1),
(2) Date: May 22, 2015

(87) PCT Pub. No.: WO2015/058983
PCT Pub. Date: Apr. 30, 2015

(65) Prior Publication Data
US 2016/0298822 A1    Oct. 13, 2016

(30) Foreign Application Priority Data
Oct. 24, 2013    (EP) .................................. 13190012

(51) Int. Cl.
*B60Q 1/26*    (2006.01)
*F21V 5/00*    (2015.01)
(Continued)

(52) U.S. Cl.
CPC .............. *F21V 5/005* (2013.01); *F21V 5/002* (2013.01); *F21V 5/007* (2013.01); *F21V 5/008* (2013.01);
(Continued)

(58) Field of Classification Search
CPC .......... F21V 5/007; F21V 5/008; F21V 5/005; F21V 5/045
See application file for complete search history.

(56) References Cited

U.S. PATENT DOCUMENTS

| 7,588,358 B1 | 9/2009 | Condon |
| 2004/0141241 A1 | 7/2004 | Claytor |
| 2004/0218390 A1 | 11/2004 | Holman |
| 2006/0139953 A1* | 6/2006 | Chou .................... G02B 3/0056 362/613 |
| 2009/0231835 A1 | 9/2009 | Roberts |
| 2010/0061090 A1 | 3/2010 | Bergman |

(Continued)

FOREIGN PATENT DOCUMENTS

| DE | 102009060566 A1 | 6/2011 |
| JP | 02275933 | 11/1990 |

(Continued)

*Primary Examiner* — Evan Dzierzynski

(57) ABSTRACT

The invention provides a lighting unit (10) comprising (i) an arrangement (111) of a plurality of light source units (100) configured to provide corresponding light source unit light (101), (ii) a first foil (210) comprising a plurality of transmissive first foil regions (211), wherein each first foil region (211) comprises a plurality of optical elements (212), and (iii) a second foil (220) comprising a plurality of transmissive second foil regions (220), wherein each second foil region (221) comprises a plurality of optical elements (222), wherein each light source unit (100) has a corresponding first foil region (211) configured downstream of said light source unit (100) and a corresponding second foil region (221) configured downstream of said first foil region (211).

18 Claims, 9 Drawing Sheets

(51) Int. Cl.
  *F21V 14/06* (2006.01)
  *F21V 5/04* (2006.01)
  *F21V 7/00* (2006.01)
  *H01L 25/075* (2006.01)
  *G02F 1/1335* (2006.01)
  *F21Y 101/00* (2016.01)
  *F21Y 105/10* (2016.01)
  *F21Y 115/10* (2016.01)
  *F21Y 105/00* (2016.01)

(52) U.S. Cl.
  CPC ............ *F21V 5/045* (2013.01); *F21V 7/0066* (2013.01); *F21V 7/0083* (2013.01); *F21V 7/0091* (2013.01); *F21V 14/06* (2013.01); *F21Y 2101/00* (2013.01); *F21Y 2105/001* (2013.01); *F21Y 2105/10* (2016.08); *F21Y 2115/10* (2016.08); *G02F 2001/133607* (2013.01); *H01L 25/0753* (2013.01); *H01L 2924/0002* (2013.01)

(56) References Cited

U.S. PATENT DOCUMENTS

| | | | |
|---|---|---|---|
| 2011/0261263 A1* | 10/2011 | Schoenfeld | G02F 1/133603 348/687 |
| 2012/0020079 A1 | 1/2012 | Chang | |
| 2012/0092863 A1* | 4/2012 | Krijn | F21S 10/00 362/231 |
| 2013/0271994 A1* | 10/2013 | Hsu | F21V 5/007 362/259 |

FOREIGN PATENT DOCUMENTS

| | | |
|---|---|---|
| JP | 2010153256 | 7/2010 |
| JP | 2011171086 A | 9/2011 |
| WO | WO2011079856 A1 | 7/2011 |
| WO | WO2014045158 A1 | 3/2014 |
| WO | WO2014045168 A1 | 3/2014 |

* cited by examiner

OPTICAL CONFIGURATIONS WITH TWO OR MORE MICRO STRUCTURED FILMS

CROSS-REFERENCE TO PRIOR APPLICATIONS

This application is a U.S. national stage application under 35 U.S.C. §371 of International Application No. PCT/IB2014/071827, filed on Oct. 13, 2014, which claims priority to and the benefit of European Patent Application No. 13190012.8, filed on Oct. 24, 2013, the contents of which are herein incorporated by reference.

FIELD OF THE INVENTION

The invention relates to a lighting unit comprising (i) an arrangement of a plurality of light source units as well as to its use.

BACKGROUND OF THE INVENTION

Single LEDs and lens assemblies are known in the art. U.S. Pat. No. 7,588,358, for instance, describes an apparatus and method for producing a light output pattern from a single LED source through a lens that diverges light at or around the center of the lens from a single source but converges light at concentric areas around the center area. The assembly can avoid a central hot spot of intensity in the light output pattern and create one or more concentric rings of higher apparent intensity.

SUMMARY OF THE INVENTION

Beam shaping is essential in all lighting applications. One category of beam shaping optical elements includes classical elements such as reflectors and collimators as used in most luminaires. Traditionally, elements belonging to this category are bulky whereas those in the second category are difficult to design and expensive to manufacture.

Hence, it is an aspect of the invention to provide an alternative lighting unit, which preferably further at least partly obviates one or more of above-described drawbacks. Especially, it is an aspect of the invention to provide an alternative lighting unit with which the beam can be shaped with a relative large freedom, while on the other hand having a relative thin construction (of the essential elements of light source(s) and optics).

Micro-optical structures and solid state light sources appear to provide a good combination that can be used for such alternative lighting unit. It surprisingly appears that when a specific multi-layer system of foils with micro-optical structures is chosen, beams can be produced that can be selected to be narrow or broad, and that can be directed.

Hence, in a first aspect the invention provides a lighting unit comprising (i) an arrangement of a plurality of light source units, configured to provide corresponding light source unit light, (ii) a first foil comprising a plurality of transmissive first foil regions ("first foil regions"), wherein each first foil region comprises a plurality of optical elements comprising an optical element with refractive functionality to the light source unit light in a center of each region and an optical element with total internal reflection functionality to the light source unit light in a peripheral area remote from said center in each region, and (iii) a second foil comprising a plurality of transmissive second foil regions ("second foil regions"), wherein each second foil region comprises a plurality of optical elements wherein each second foil region comprises at its center an optical element with refractive functionality to the light source unit light and in a peripheral area remote from its center an optical element with total internal reflection functionality to the light source unit light; wherein each light source unit has a corresponding first foil region configured downstream of said light source unit and a corresponding second foil region configured downstream of said first foil region.

Especially, such lighting unit may beneficially be used to control the shape of a beam of light from the light source unit light of the arrangement of a plurality of light source units. For instance, such lighting unit can be used to provide said beam of light (i.e. the (beam of) light generated by the lighting unit (downstream of the second foil)) having a full width half maximum (FWHM) of less than 20°, such as less than 15°; even less than 10° is possible. Alternatively (or additionally), the lighting unit may also be used to control one or more of the shape and direction of said beam of light. Hence, a surprising versatile lighting unit is herein provided. Especially, by choosing the first foil to be homogenizing and the second foil to be collimating, one may obtain a relative narrow beam width, and by choosing the first foil to provide focused beams in combination with shiftable (or transportable) elements, one may be able to tune the beam shape from narrow to broad.

The lighting unit comprises an arrangement of a plurality of light source units. In an embodiment the center of each region of the first foil and a corresponding light source unit are aligned on a respective normal vector to the arrangement of plurality of light source units. This arrangement is especially a 2D arrangement, and especially the arrangement is regular, such as a cubic arrangement or a hexagonal arrangement. However, the arrangement may also be irregular. The arrangement of the light source units especially imposes the arrangement of the plurality of first foil regions and (the plurality of) second foil regions (see also below), as especially each light source unit has a corresponding first foil region and (downstream thereof a) second foil region. In case the light source units are arranged regular, the shortest distance between adjacent light source units (measured from a central point from the light source units) can also be indicated as pitch. In an embodiment, there may be (two) different pitches in (two) different directions. As the arrangement may be regular or irregular, or a combination thereof, and as the pitches may be constant all over the arrangement or may be different in (two) different directions, herein also a mean shortest distance (measured from a central point from the light source units) is defined. For the regions on each foil a similar definition of "pitch" applies. A region is a group of optical elements mutually positioned in a specific arrangement. Said specific arrangement is repeated with a (mean) periodicity, thus defining a shortest region distance, or region pitch, between two adjacent regions. For irregular arrangements of regions this results in a mean region pitch of the regions. For light source units and regions on the first foil to mutually correspond, the (ir)regular arrangement and the mean pitch of both light source units and regions preferably are identical, enabling the center of each region of the first foil and a corresponding light source unit to be aligned on a respective normal vector to the arrangement of plurality of light source units. Optionally this configurational relationship applies also to light source units and the regions on the second foil.

The mean shortest distance may in general be in the range of 0.5-100 mm, such as at least 1 mm, like especially in the range of 5-50 mm. The arrangement includes a plurality of light source units, such as e.g. at least 4, like at least 16, such as at least 25, like at least 49, or even more at least 100 light source units. Note however that substantially larger numbers are also possible.

In a specific embodiment, the light source unit comprises a solid state light source (such as a LED or laser diode). In a further specific embodiment, the plurality of light source units comprises two or more subsets, which may be independently controllable. Alternatively or additionally, the plurality of light source units comprises two or more subsets which are configured to generate light source unit light having different colors. As indicated above, and further elucidated below, each light source unit may address a specific first foil region. The light source unit itself may in a specific embodiment include one light source, such as a solid state light source, like a LED or laser diode. In such embodiment, the light source unit may essentially consist of the light source. However, in yet another embodiment, the light source unit comprises two or more light sources, which may optionally also be independently controllable. Therefore, in a specific embodiment, one or more of the light source units, especially a plurality, such as at least 80% of the total number of light source units, may comprise at least a first solid state light source and a second solid state light source, wherein a subset of the first solid state light sources and a subset of the second solid state light sources are individually controllable. To this end, the lighting unit may further comprise a control unit, configured to control the lighting unit, especially the subset of the first solid state light sources and the subset of the second solid state light sources. Of course, there may be more than two subsets. Hence, the lighting unit may comprise a plurality (≥2) of subsets, each individually controllable. In further embodiments, there may be one or more light source units comprising more than two different light sources, such as more than two different solid state light sources, e.g. each having a different color or different color temperature.

As indicated above, the lighting unit comprises at least two foils, although more than two foils may be available. Here, the invention is mainly illustrated with respect to two foils, and in some embodiments in relation to three foils. The foils are especially arranged parallel to each other and parallel to the arrangement of the plurality of light sources. In general, there will be non-zero distances between the light source units and the first foil (see also below), and between the first foil and the second foil. The total thickness of each foil may be in the range of 0.2-20 mm, especially 0.2-5 mm, including the optical elements. The foils may have cross-sectional areas in the range of 4 mm$^2$-50 m$^2$, although even larger may be possible. Also tiles of foils, arranged adjacent to each other, may be applied. The foils are transmissive, i.e. at least part of the light, especially at least part of the visible light illuminating one side of the foil, i.e. especially the upstream side, passes through the foil, and emanates from the foil at the downstream side. This results eventually in the lighting unit light. Especially, the foils comprise, even more especially substantially consist of, a polymeric material, especially one or more materials selected from the group consisting of PE (polyethylene), PP (polypropylene), PEN (polyethylene naphthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), (PETG) (glycol modified polyethylene terephthalate), PDMS (polydimethylsiloxane), and COC (cyclo olefin copolymer). However, other (co)polymers may also be possible. Hence, also the foil regions of the respective foils are transmissive for at least part of the light of the light source(s).

The first foil is arranged downstream of the light source units, and the second foil is arranged downstream of the first foil; the first foil thus being arranged upstream of the second foil. The terms "upstream" and "downstream" relate to an arrangement of items or features relative to the propagation of the light from a light generating means (here the especially the light source unit(s)), wherein relative to a first position within a beam of light from the light generating means, a second position in the beam of light closer to the light generating means is "upstream", and a third position within the beam of light further away from the light generating means is "downstream".

Each foil comprises a plurality of foil regions, indicated as (transmissive) first foil regions and (transmissive) second foil regions, respectively. Approximately, the number of light source units corresponds to the number of first foil regions and second foil regions. Anyhow, in principle any first foil region has a single corresponding light source unit and a single corresponding second foil region. The term corresponding in those phrases especially indicates that a light source unit is configured to illuminate substantially only a single (corresponding) first foil region. For instance, at least 85% especially at least 95%, of the spectral power (watt) of the light source unit may illuminate the corresponding first foil region. The light source unit and its corresponding first foil region are configured to illuminate substantially only a single (corresponding) second foil region. For instance, at least 85%, especially at least 95%, of the spectral power (watt) of the light downstream from the first foil region may illuminate the corresponding second foil region. Note that when the light source unit comprises a plurality of light sources, these data apply to a single light source (in operation). Especially, over 85%, even more especially over 90%, of the upstream side of the first foil is illuminated by the plurality of light source units (during operation of the lighting unit. Hence, a substantial part of the first foil provides the first foil regions. Instead of the term side, like in upstream side, also the term face may be applied.

Each foil region comprises a plurality of optical elements. These optical elements may especially comprise one or more of prismatic elements, lenses, total internal reflection (TIR) elements, refractive elements, facetted elements. Optionally, a subset of elements may be translucent or scattering (see also below). In general, at least a subset, or all of the optical elements are transparent. The optical elements may be embedded in the foil, and may especially be part of a foil side (or face), such as especially a downstream side or an upstream side, or both the downstream and upstream side. Herein, the optical elements are especially further described in relation to optical elements having a Fresnel or refractive function and optical elements having a total internal reflection function. Each optical element may comprise one or more facets The facets may be arranged at an upstream side or a downstream side or both the upstream side and downstream side of the foil (first and/or second foil, etc.). Especially, TIR elements are especially available at an upstream side of the foil (first and/or second foil), whereas the refractive elements, such as Fresnel lenses, may be arranged at the upstream and/or downstream side of the foil (first and/or second foil). The dimensions of the facets (of these elements), especially of the TIR elements, like height, width, length, etc., may in embodiments be equal to or below 5 mm, especially in the range of 0.01-5, such as below 2 mm, like below 1.5 mm, especially in the range of 0.01-1 mm. The diameters of the refractive Fresnel lenses may in embodiments be in the range of 0.02-50 mm, such as 0.5-40 mm, like 1-30 mm, though less than 30 mm may thus (also) be possible, like equal to or smaller than 5 mm, such as 0.1-5 mm. The height of these facets will also in embodiments be below 5 mm, such as below 2 mm, like below 1.5 mm, especially in the range of 0.01-1 mm. Here the term "facet", especially in TIR embodiments, may refer to a (substantially) flat (small) faces, whereas the term "facet", especially in Fresnel embodiments, may refer to curved faces. Thus curvature may especially be in the plane of the foil, but also perpendicular to the plane of the foil ("lens"). The Fresnel lenses are not necessarily round, they may also have distorted round shapes or other shapes.

In an embodiment, at least 85%, even more especially over 90%, of the total number of first foil regions are identical (i.e. especially forms a regular structure or regular lattice of first foil regions). Likewise, this may apply to the second foil: in an embodiment, at least 85%, even more especially over 90%, of the total number of second foil regions are identical (i.e. especially forms a regular structure or regular lattice of second foil regions). In a further specific embodiment, each combination of light source unit, first foil region, and second foil regions, is (substantially) identical with respect to geometry and optics.

In a specific embodiment, each first foil region comprises an optical element with refractive functionality to the light source unit light and an optical element with total internal reflection (TIR) functionality to the light source unit light and(/or) further especially each second foil region comprises an optical element with refractive functionality to the light source unit light and an optical element with total internal reflection functionality to the light source unit light. Especially with such configuration, narrow (collimated) beams can be generated. It further appears advantageous to control the distance to the first foil and the mutual distance between light source units. Hence, in a specific embodiment the light source units have a mean shortest distance (p) and wherein the light source units have a shortest distance (d1) to the first foil, wherein d1/p≤0.3. In a regular arrangement such as a hexagonal or cubic arrangement, the mean shortest distance is the pitch.

As already indicated above, especially the first foil regions may be configured to improve homogeneous illumination of the second foil regions with the light source unit light. Without the first foil, the illumination of the second foil may be substantially spot wise, whereas now with the first foil, a more homogeneous illumination may be achieved. This may further be improved by providing the optical elements of the first foil on an upstream side and providing scattering elements downstream from the upstream side of the first foil, preferably on a downstream side of the first foil. In yet another embodiment, the first foil regions are alternatively or additionally configured to improve collimation of the light source unit light.

A substantial homogeneous illumination of the second foil may for instance be achieved by choosing refractive and TIR optical elements, with especially in the center of the first foil regions elements with refractive properties, such as Fresnel lens like optical element, and more remote from the center (and closer to the boundaries of the first foil regions) TIR optical elements. In such embodiments, also the second foil may be configured to promote collimation. Hence, in a further embodiment the second foil regions are configured to improve collimation of (i.e. especially to collimate) the light source unit light downstream from the first foil. Narrow beam widths with FWHM below 10° can be obtained in this way. Hence, in these embodiments, the second foil may have a collimation function. Also here, especially in the center of the second foil regions elements with refractive properties may be found and more remote from the center (and closer to the boundaries of the first foil regions) TIR optical elements. As indicated above, these optical elements may be arranged at the upstream side of the first foil, with optionally scattering elements at the downstream side.

With the above indicated embodiments, a relative homogeneous illumination of the second foil (regions) may be achieved. Hence, in embodiments the first foil may especially be configured to promote homogeneous illumination of the second foil. Note that the light source units, which are especially solid light source based, may substantially be point sources, which provide an inhomogeneous illumination. In some embodiments, this may not be desired.

Optionally, the first collimation is divided over two or more foils. Hence, in an embodiment, the lighting unit comprises an upstream first foil, configured downstream from the plurality of light sources, and a downstream first foil, configure downstream from the upstream first foil, wherein upstream first foil is configured to precollimate the light source unit light by the optical elements, and wherein the downstream first foil is configured to further collimate the source unit light by further collimating elements downstream from the upstream first foil. With such embodiment, collimation may even be higher than with a single first foil. The upstream first foil and downstream first foil may be substantially identical with respect to the width, type of optical elements and location of optical elements. The number of (upstream) first foil regions and (downstream) first foil regions will in general be the same, and also the same as the number of light source units (see also above).

In yet further embodiments, different from some of the above described embodiments, each first foil region is configured to provide a plurality of beams (B). This may not add to homogeneity, as beams are generated, but on the other hand, this may allow tuning of the beam properties, especially when elements of the lighting unit may be able to be transported (by an actuator) (see also below). In a further specific embodiment each first foil region comprises a plurality of optical elements having Fresnel functionality. The optical elements having Fresnel functionality may be Fresnel lenses, but may optionally also be distorted Fresnel lenses, e.g. to accommodate at least partly the symmetry (if any) of the (first foil) region(s). Hence, in the embodiments the first foil may have the function of focusing on second foil, especially providing a plurality of beams, and the second foil may have the function of creating several beam spots. In yet a further embodiment, each of the second foil regions comprises a plurality of optical elements having prismatic shapes, wherein the number of optical elements having a prismatic shape per second foil region is n times the number of plurality of beams (B) as in the embodiment(s) wherein a plurality of beams are generated, wherein n is a natural number equal to or larger than 1. Hence, in such embodiment each beam may address a corresponding set of optical elements. For instance, the first foil regions may be configured to generate 5 beams and the second foil regions comprise 5 (sub regions with) optical elements, i.e. 5n optical elements. For instance, each corresponding sub region may comprise a plurality of (substantially identical) optical elements, especially the above indicated prismatic optical elements. The prismatic shapes or elements may essentially comprise two (substantially flat) facets arranged under an angle with each other and especially arranged under angle (>0° and <90° relative to a plane through the foil).

Dependent upon the first foil and the second foil more narrow or more broad beams can be generated. A specific feature is that an element of the lighting unit may be a (slightly) transported (relative to other items of the lighting unit), such as >100 µm, like 100 µm-5 mm, by with e.g. the width of the beam may be tuned. Transportation may include e.g. translation or rotation. Hence, in a further specific embodiment, in a direction parallel or perpendicular to the first arrangement of light source units (and the second foil) one or more can be transported in a transporting action selected from the group consisting of: (i) one or more of the light source units, (ii) the first foil, and (iii) the second foil. To this end, the lighting unit may further comprise an actuator configured to execute the transporting action. Such actuator may for instance include a piezo element for inducing especially a translation.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

The drawings are not necessarily on scale.

DETAILED DESCRIPTION OF THE EMBODIMENTS

Figure 1A:
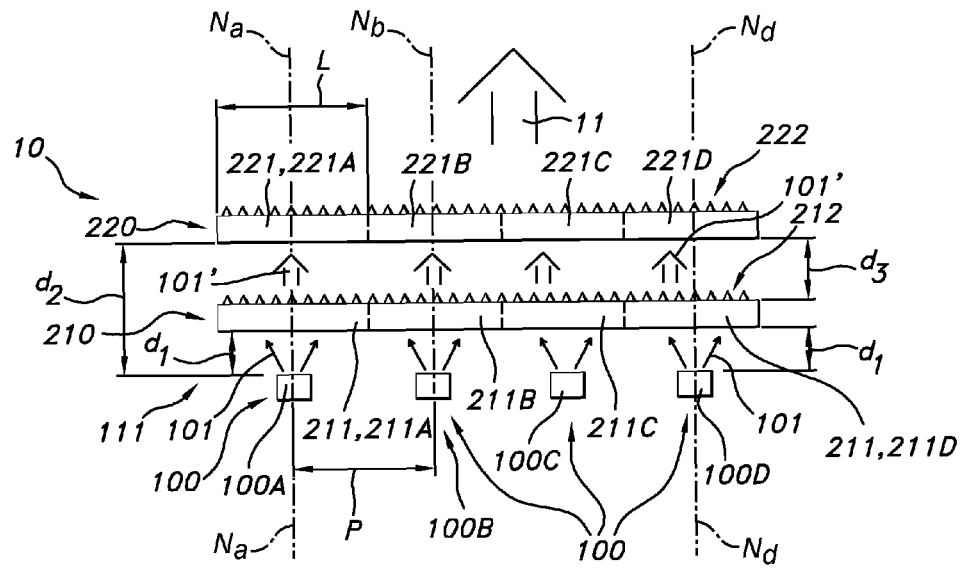
FIGS. 1a-1b schematically depict some basic aspects of the invention.

FIG. 1a schematically depicts an embodiment of a lighting unit 10 comprising (i) an arrangement 111 of a plurality of light source units 100 configured to provide corresponding light source unit light 101. Here, by way of example four light source units 100, indicated with references 100A-100D, are schematically depicted. The lighting unit 10 further comprises (ii) a first foil 210 comprising a plurality of transmissive first foil regions 211, wherein each first foil region 211 comprises a plurality of optical elements 212. Here, the plurality of light source units 100 have a corresponding number of first foil regions 211, indicated with reference numbers 211A-211D. The lighting unit 10 further comprises (iii) a second foil 220 comprising a plurality of transmissive second foil regions 221, wherein each second foil region 221 comprises a plurality of optical elements 222.

Again, the plurality of light source units 100 have a corresponding number of second foil regions 221, indicated with reference numbers 221A-221D. Hence, each light source unit 100 has a corresponding first foil region 211 configured downstream of said light source unit 100 and a corresponding second foil region 221 configured downstream of said first foil region 211. This is herein also indicated as cell (here, in FIG. 1a: four cells). Each region on the first foil and a corresponding region on the second foil is aligned with a corresponding light source unit on a respective normal vector N, indicated with reference Na-d, to the arrangement of the plurality of light source units.

Light from the light source units 100 downstream of the first foil is indicated with reference 101'; the light downstream from the second foil 220, is indicated as lighting unit light 11. The light source units 100 have mean shortest distance (here pitch) (measured from a central point from the light source units), indicated with p; the shortest distance to the first foil, i.e. the distance to the first foil downstream of the light source units is indicated with reference d1. The regions may have (largest) lengths and (largest) width indicated with reference L, which may be in the range of the mean shortest distance p. The shortest distance between the light source unit and the second foil 220 is indicated with d2; the distance between the first foil and second foil is indicated with reference d3. Characteristic dimensions may be:

| | Unit | (first) beam shaping embodiment | (second) beam shaping embodiment |
|---|---|---|---|
| Number of light source units | | 1-1,000,000 | 1-1,000,000 |
| d1 | mm | 0.1-25 | 0.1-25 |
| d2 | mm | 1-100 | 1-100 |
| d3 | mm | 1-100 | 1-100 |
| L | mm | 1-100 | 1-100 |
| Function first foil | | uniform illumination of second foil | focusing on second foil |
| Type of optical elements first foil | | refractive/TIR (facets, lenses) | refractive/TIR (facets, lenses) |
| Dimensions of (TIR) optical elements first foil | mm | 0.01-5 | 0.01-5 |
| Function second foil | | collimation | several beam spot creations |
| Type of optical elements second foil | | refractive/TIR (facets, lenses) | Refractive/TIR (facets, lenses) |
| Dimensions of (TIR) optical elements second foil | mm | 0.01-5 | 0.01-5 |

Figure 3A:
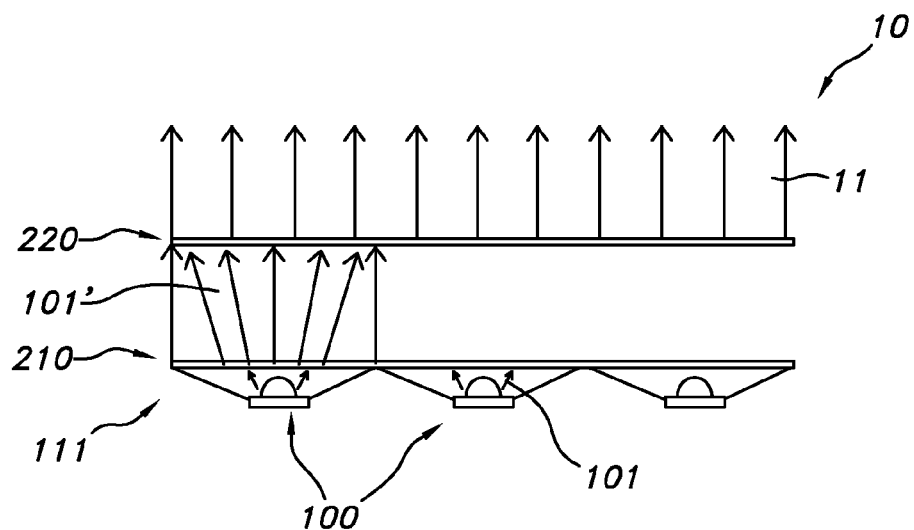
FIGS. 3a-3f (schematically) depict an embodiment of the invention (and variations thereon)
Figure 3B:
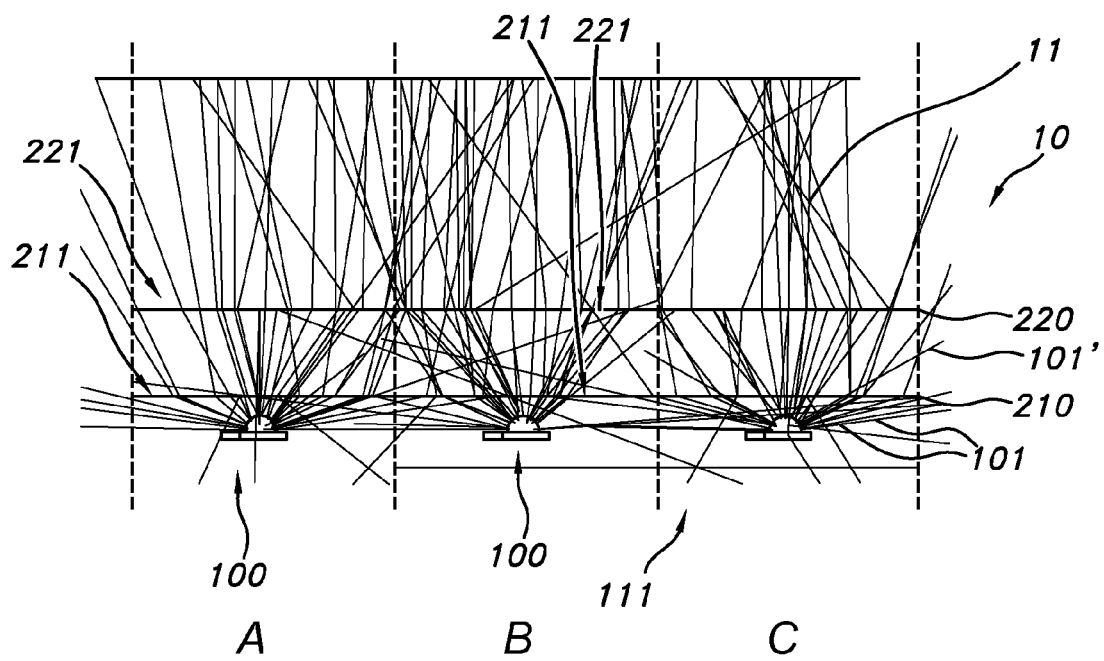
Figure 3C:
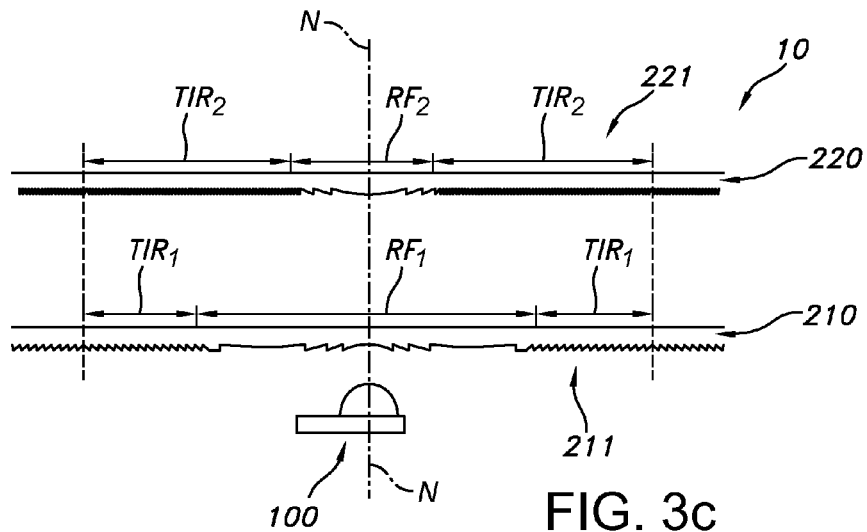
Figure 3D:
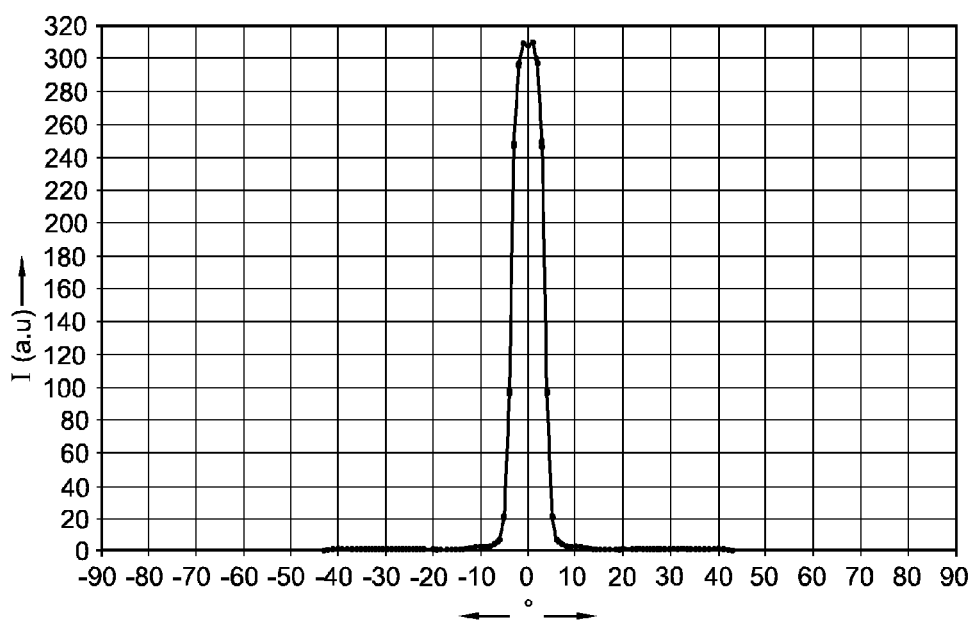
Figure 3E:
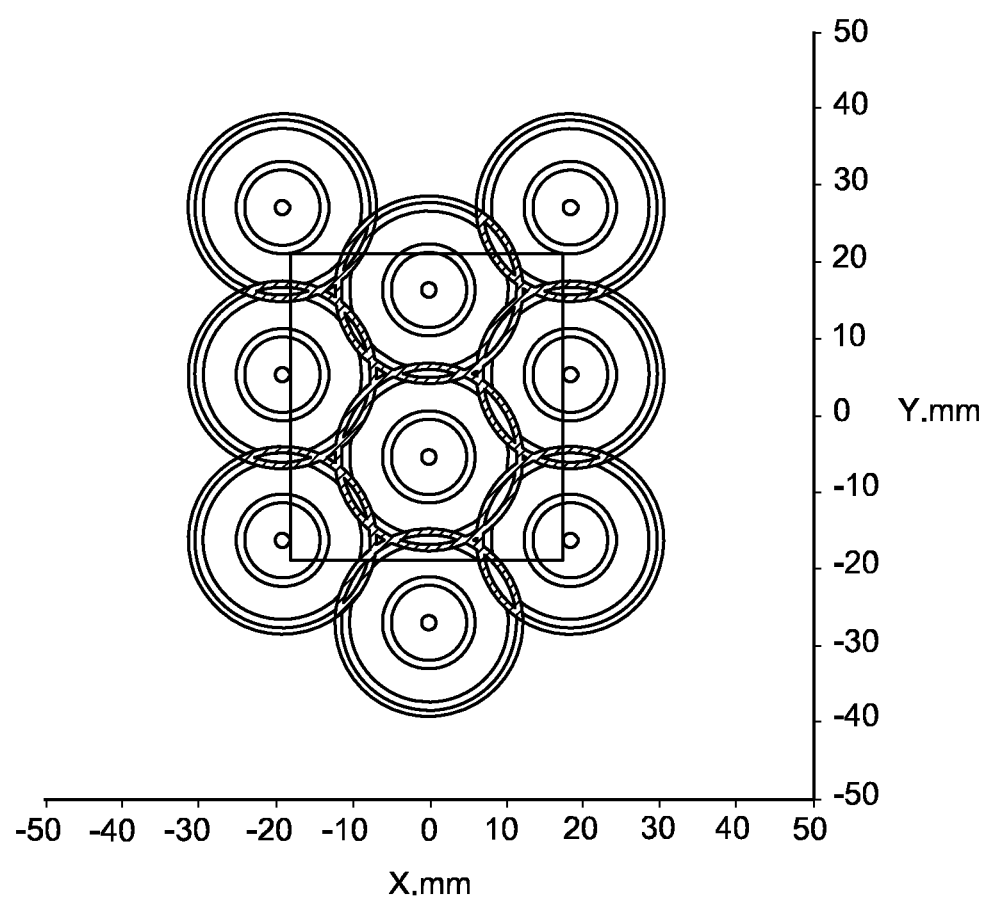
Figure 3F:
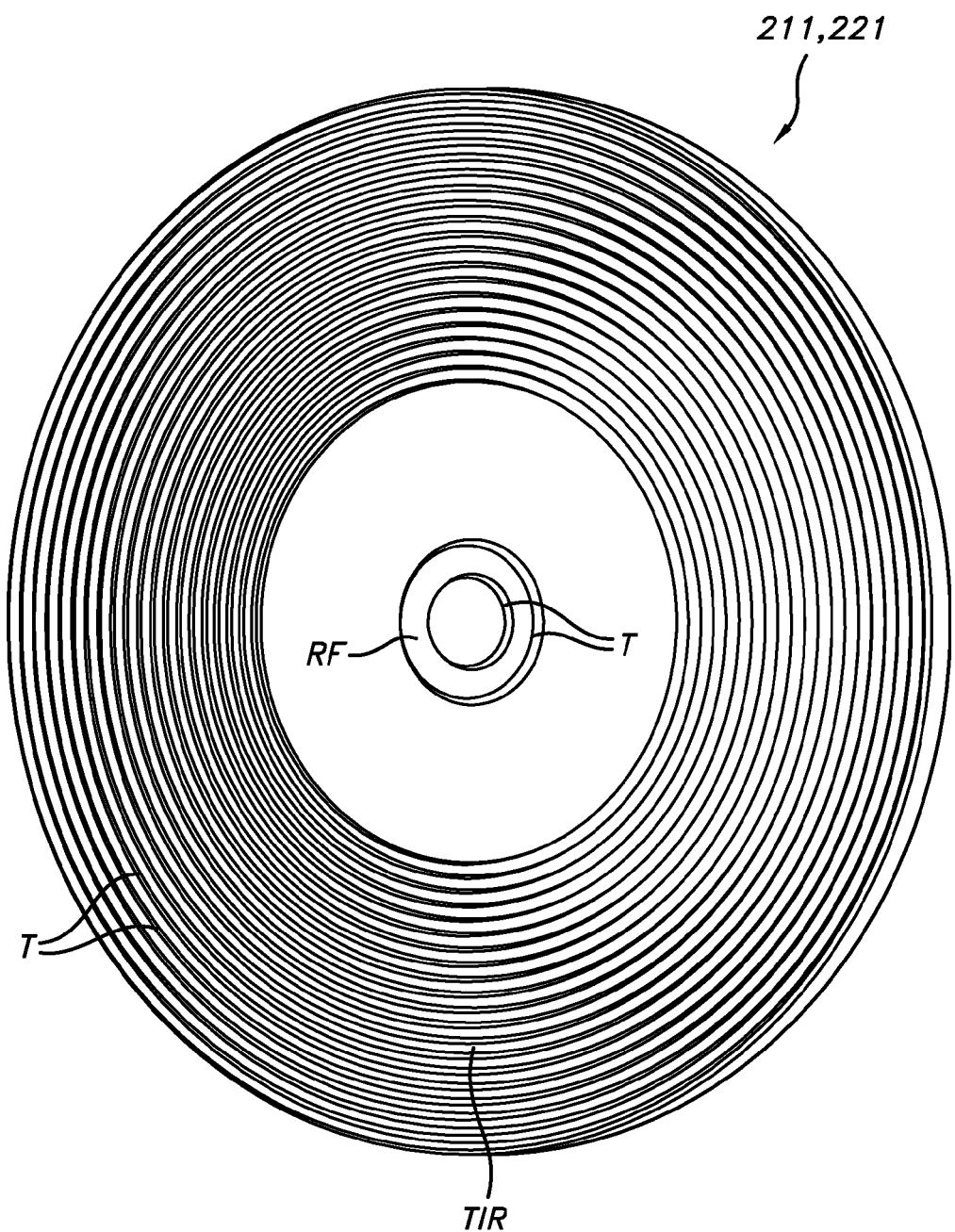
Figure 4A:
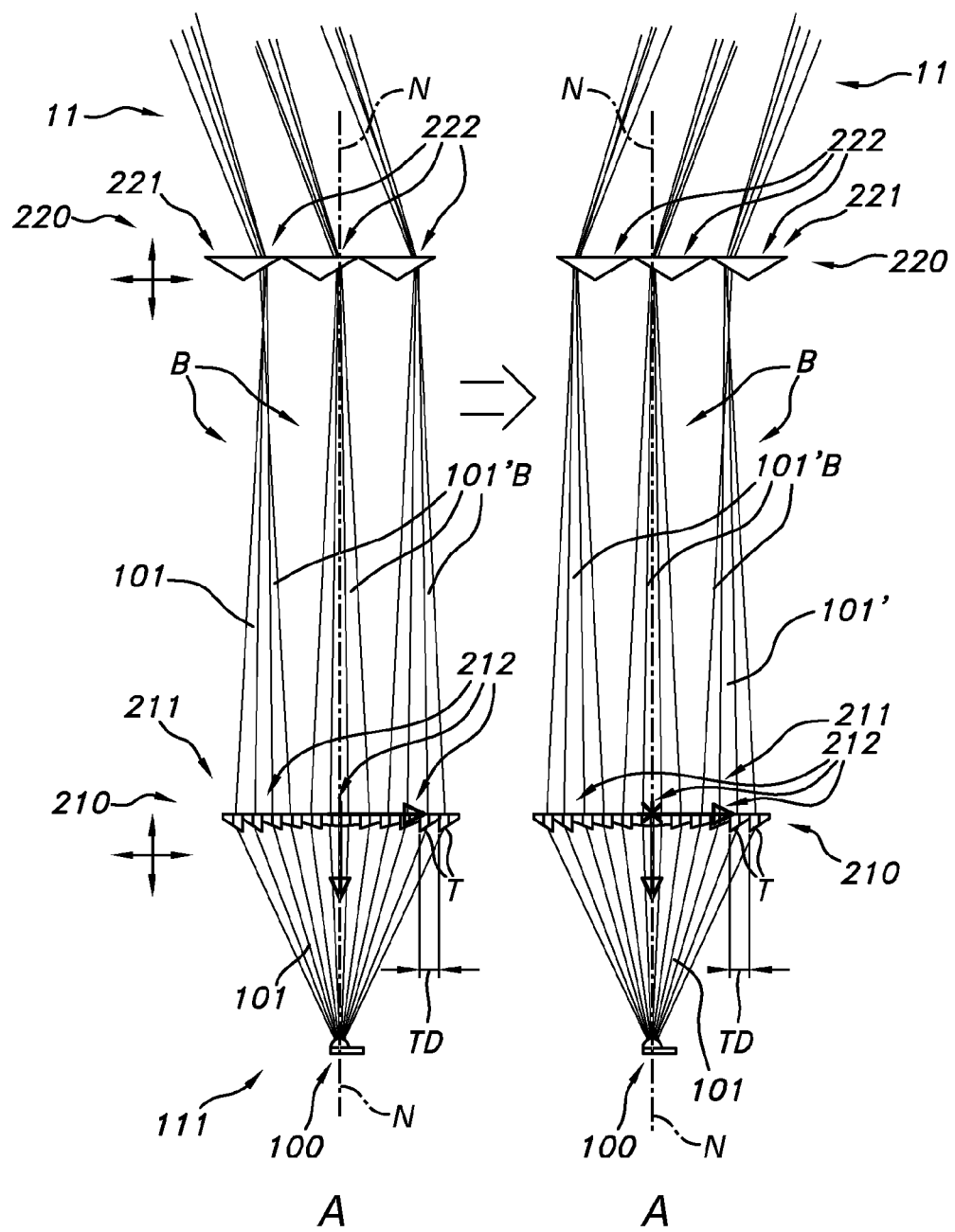
FIGS. 4a-4c (schematically) depict a further embodiment of the invention (and variations thereon).
Figure 4B:
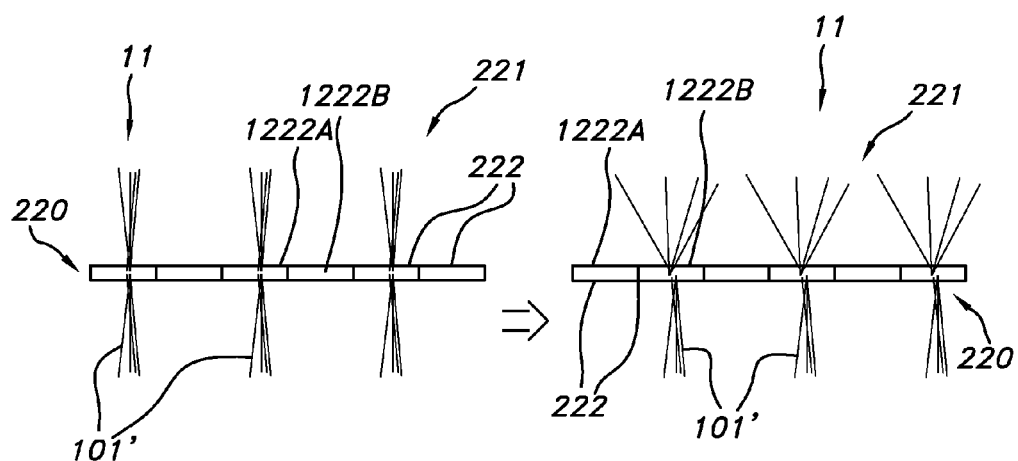

Variants of the first beam shaping are especially depicted in FIGS. 3a-3f and variants of the second beam shaping embodiment are especially depicted in FIGS. 4a-4b.

In FIG. 1a, four (identical) combinations (or "cells"), indicated with references A, B, C, D of the light source unit, first foil region and second foil region, are schematically depicted.

Figure 1B:
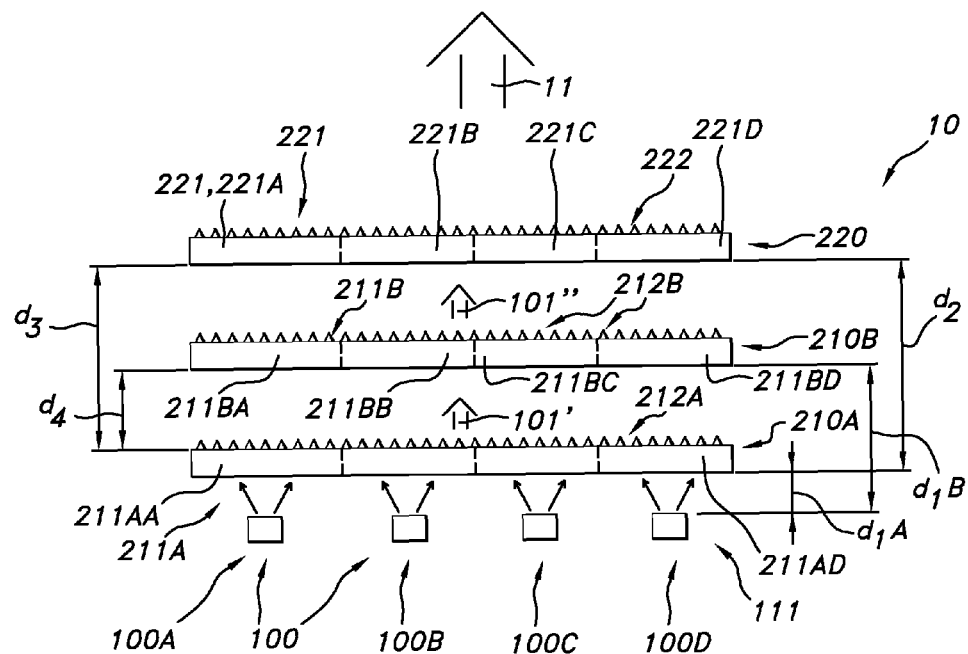

FIG. 1b schematically depicts an embodiment wherein three foils are applied (more than three foils may also be applied). Here, the lighting unit 10 comprises an upstream first foil 210A, configured downstream from the plurality of light sources 100, and a downstream first foil 210B, configured downstream from the upstream first foil 210A. Especially, the upstream first foil 210A is configured to precollimate the light source unit light 101 and the downstream first foil 210B is configured to further collimate the source unit light 101 downstream from the upstream first foil 210A. Characteristic dimensions for the upstream first foil and downstream first may be as described above for the first foil.

Light downstream of the downstream foil 210B is indicated with reference 101". The regions are indicated correspondingly, with regions 210AA-210AD for the first foil regions 210A, and with regions 210BA-210BD for the second foil regions 210B. The distance from the light source units to the upstream first foil 210A is indicated with reference d1A; to the downstream first foil 210B with reference d1B; the distance between these two foils is indicated with reference d4, which may be in the order of d3 for the two-foil system (FIG. 1a).

In the (first) beam shaping embodiment, the first two foils realize an—as much as possible—parallel beam and a uniform spatial and angular light distribution. The beam shaping is done in the newly added 3rd foil. The advantage is that the 3rd foil is independent of the position of the LEDs, the number of LEDs, and the distances between the foils. This improves flexibility and late-stage configurability. The optical efficiency will, however, be reduced in this case.

In FIGS. 1a and 1b schematically the optical elements 211 and 222 are depicted at the downstream sides of the respective foils. However, optical elements may alternatively or additionally be available at the upstream sides of the respective foil.

Figure 2A:
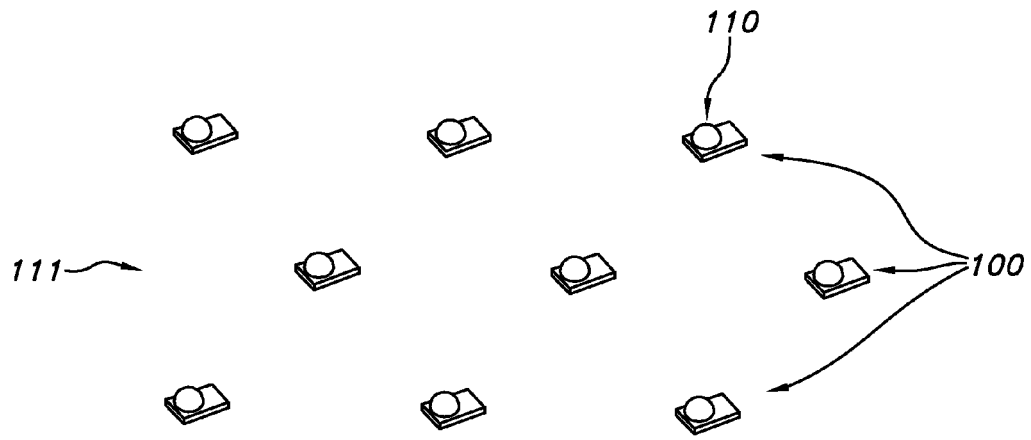
FIGS. 2a-2f schematically depict some embodiments of the invention.
Figure 2B:
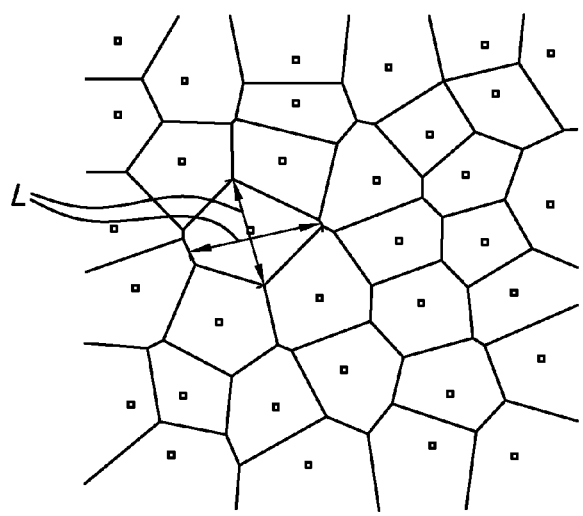

FIG. 2a schematically depicts an arrangement 111 of a plurality of light source units 100 (here in fact solid state light sources) in a hexagonal arrangement, i.e. a regular arrangement; FIG. 2b schematically depicts a less regular or even non-regular arrangement (as Voronoi diagram). This arrangement may thus apply to the arrangement of the plurality of light source units, but also the accompanying plurality of transmissive first foil regions and second foil regions, as the lighting unit may comprise a plurality of unit cells, each unit cell comprising a light source unit, a corresponding first foil region and a corresponding second foil region.

Figures 2C, 2D:
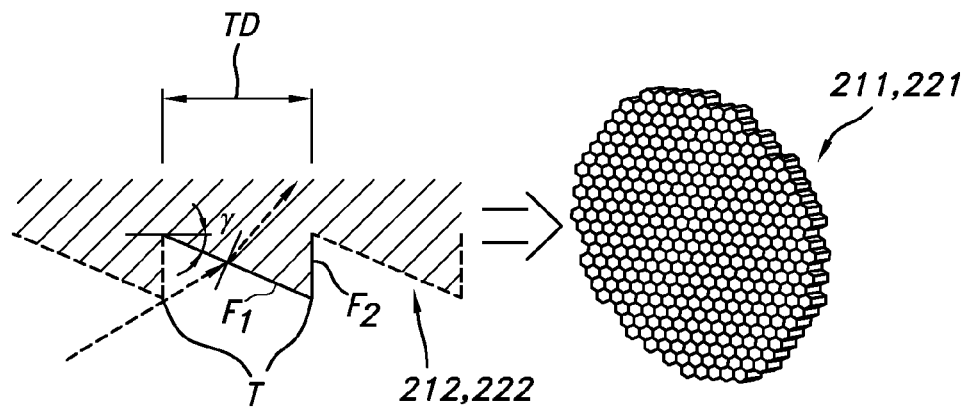

For instance, microstructures that redirect the light by using refraction and microstructures that redirect the light by using TIR may be applied as optical elements. The refractive elements are typically used for light that enters the foil over small angles with the main normal of the foil and the TIR elements for the light that enters the foil over larger angles. An example of refractive elements are the facet arrays. FIGS. 2c and 2d show a facet array in 2D and in 3D, respectively. The tops of the optical elements are indicated with reference T; the distance (or pitch) between the tops is indicated with reference TD. References F1 and F2 indicate faces or facets. Reference γ indicates the facet or Fresnel lens angle (assuming a Fresnel lens). Characteristic dimensions, especially of the TIR elements, may be:

| | Unit | (first) beam shaping embodiment (FIG. 3a) | (second) beam shaping embodiment (FIG. 4a) |
|---|---|---|---|
| T first foil (height) | mm | 0.05-5 | 0.05-5 |
| TD first foil | mm | 0.01-50, such as 0.05-5 | 0.01-50, such as 0.05-5 |
| T optional intermediate foil (see FIG. 1b) (height) | mm | 0.05-5 | 0.05-5 |
| TD optional intermediate foil (see FIG. 1b) | mm | 0.05-5 | 0.05-5 |

-continued

| | Unit | (first) beam shaping embodiment (FIG. 3a) | (second) beam shaping embodiment (FIG. 4a) |
|---|---|---|---|
| T second foil (height) | mm | 0.05-5 | 0.05-5 |
| TD second foil | mm | 0.01-50, such as 0.05-50, like 0.05-5 | 0.01-50, such as 0.05-50, like 0.05-5 |

Figures 2E, 2F:
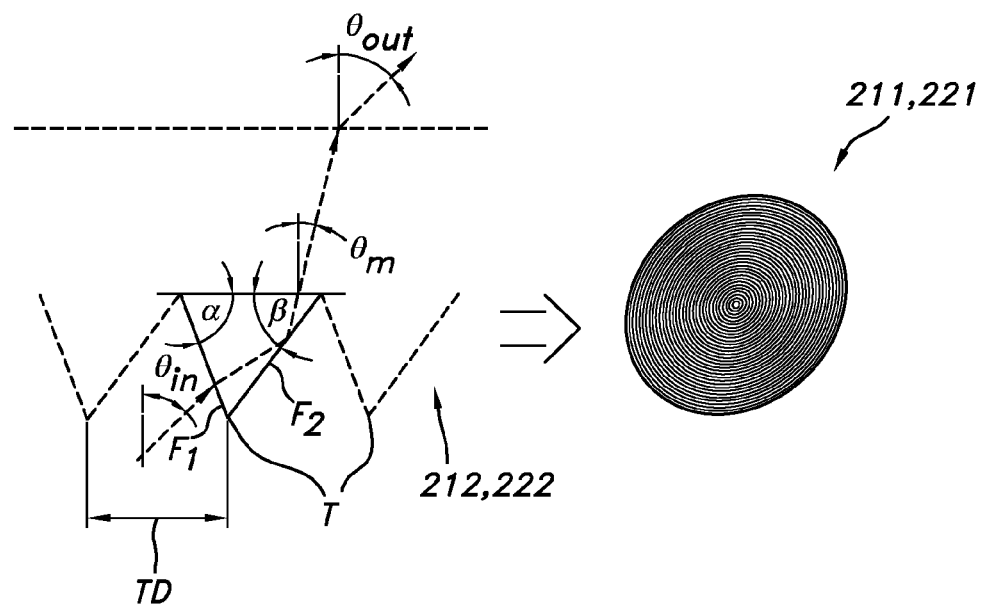

FIG. 2e shows a TIR element in 2D. In FIG. 2e, light enters the left surface by refraction. Then it reflects at the second surface by TIR. To get from this 2D model to a 3D model, in a non-limiting embodiment, we sweep the 2D model around the vertical axis. This gives the rotationally symmetric structure that is also depicted in FIG. 2f. Reference $\theta_{in}$ indicates the angle of incidence of a ray of light (arrow) on the element and $\theta_m$ indicates the angle of refraction in the medium and $\theta_{out}$ indicates the refraction out of the medium. Reference $\alpha$ indicates the angle of the facet, indicated with reference F1, with the plane of the foil; and reference $\beta$ indicates the (other) facet, indicated with reference F2. Hence, the TIR elements may especially be indicated by the angles $\alpha$ and $\beta$, which are especially in the order of about at least 30°. The value of $\gamma$ is especially in the range of at maximum 55°; this is the angle of facet F1 with the plane of the foil. The angle of facet F2 with the plane of the foil in the case of TIR refractive elements may especially be close to perpendicular, such as >80°. Note that in case of Fresnel lenses, the facets F1 may be curved, and the indicated angle $\gamma$ may especially be a maximum angle.

In order to realize a thin luminaire, a high optical efficiency, controlled beam shaping, reduced glare, and a (more or less) uniform appearance over all angles with no visibility of individual glary LEDs, it is our invention to use the following optical configuration. The LED sources are positioned in some kind of 2D grid, for example, the hexagonal grid shown in FIG. 2a or a rectangular grid. Any other layout is also possible. This layout need not be regular (see also FIG. 2b). Then, two plates or foils with microstructures are added. The first foil (i.e., the foil closest to the LEDs) makes that we have more or less a uniform spatial light distribution at the second foil. That is, the first foil makes that at any location of the second foil we have approximately the same amount of lumens per unit of area. The second foil realizes the beam shaping. The configuration is depicted in FIG. 3a, where the light beam is shaped into a narrow spot.

FIGS. 3a-3f schematically depict some aspects of a specific embodiment and variants.

We now discuss these two foils in a bit more detail. As indicated, the first foil realizes in first beam shaping embodiments a more or less uniform illumination at the second foil (see FIG. 3a). The degree of uniformity can, for instance, be expressed by:

$$\frac{I_{max} - I_{min}}{I_{max} + I_{min}}$$

where $I_{max}$ and $I_{min}$ are the maximum and minimum illuminance at the second foil, respectively. The value is bounded between 0 and 1. The larger the value, the more uniform the illuminance is. Hence, to claim in the invention some minimum degree of uniformity we can claim that the expression is at least some constant C. A possible value of C is $\frac{1}{10}$. The function of the second foil is to apply beam shaping.

The beam shaping is done in such a way that any small region of the $2^{nd}$ foil produces approximately the same beam. If these regions are small enough (e.g. 1 mm$^2$), we realize a more or less uniform angular light distribution. Having the above basic description of our invention (i.e., the 2-foil configuration and the function of the 2 foils), we now describe some aspects of our invention.

A first aspect of the invention is the ratio between the LED pitch P and the distance to the first foil $d_1$. The ability of shaping the light in the first foil depends on the beam width of the light entering the foil at any location. The smaller the beam width of the incoming light, the more precise we can redirect the light to a certain position of the second foil. Obviously, the more LEDs contribute to the incoming light at the location, the larger the beam width. Hence, in order to get a small beam width, the amount of light that enters a given location must either be very little or the light must mainly come from a single LED. This can be realized by letting the ratio $d_1/P$ be small enough. For instance, smaller than 0.25 or, more preferably, 0.15.

Another aspect of the invention is the following. As for the first foil, it also holds for the second foil that, in order to perform beam-shaping, it is important that light that enters a given location must mainly come from a single LED (except for some small transition regions). To this end, we design the first foil such that it not only uniformly illuminates the second foil, but that it does this in such a way that this property is satisfied. More precisely, if we have n sources, the second foil is partitioned into n cells, such that there is a one-to-one mapping between the sources and the cells they illuminate. The most obvious partition is given by the Voronoi diagram with the set of sources as generators. The cell illuminated by a source is then the cell on the second foil directly above it; see FIG. 2b. A third aspect of the invention is the type of microstructures in the first foil. Typically, this is a combination of refractive elements and TIR elements (see also above).

As embodiment of the invention, we show how the invention can be used to build a thin spot with a uniformly illuminated exit window. We start with an array of 9 LEDs. These LEDs are positioned in a hexagonal grid, where the sides of the hexagons are 12.5 mm. That is, we (virtually) partition the PCB with the LEDs into 9 equally sized hexagons with an edge length of 12.5 mm and we position the LEDs in the center of the hexagons. This is visualized in FIG. 2a. Note that the hexagonal partition of the plane corresponds to the Voronoi diagram obtained by taking the LEDs as the generators.

In this placement of LEDs, two successive rows have a mutual displacement of half a hexagon and the pitch of the LEDs within a row is 21.65 mm. At $d_1$=3 mm from the LEDs, we place a first micro-structured foil. We then have $d_1/P$=3/21.65=0.14 if as pitch P we take two LEDs located in the same row. A second microstructured foil is placed at 10 mm from the LEDs. As described by the invention, the first foil makes that the second foil is uniformly illuminated. The second foil redirects the light into—as much as possible—a parallel beam. Furthermore, the microstructures are designed such that the following holds. If we partition the first and second foil into 9 hexagonal cells in the same way as we did for the PCB, then hexagonal cells in the foils are mainly illuminated by the LED directly below it, and only marginally from other LEDs. This is depicted in FIG. 3b which shows a side view of the foils. Here, three (identical) combinations (or "cells"), indicated with references A, B, C of the light source unit, first foil region and second foil region, are schematically depicted. The vertical lines depict the border between the hexagonal cells. FIG. 3c shows that the two foils are implemented by a combination of refraction and TIR. For each foil a respective region 211, 221 is shown, said respective regions are mutually corresponding, are corresponding with a respective light source unit 100, and are aligned on a respective normal vector N. Said respective normal vector N extends through the light source unit and through respective centers, i.e. a refraction area indicated by RF1 respectively RF2, of the respective regions on the first and second foil. Each region further comprises remote from the center a respective peripheral area, i.e. a total internal reflection area indicated by TIR1 respectively TIR2. FIGS. 3d and 3e show the far-field intensity distribution and the illuminance of the second foil, respectively. FIG. 3d (Far field distribution of spot) shows that we have obtained a spot with a FWHM of only 7 degrees. The illuminance uniformity $$\frac{I_{max} - I_{min}}{I_{max} + I_{min}}$$

in the rectangular region is 0.5. FIG. 3e shows the illuminance of second foil. The illuminance uniformity in the rectangular region is 0.5. Note that in FIGS. 3a-3b each combination of light source unit, first foil region, and second foil regions, is (substantially) identical with respect to geometry and optics. This may lead to the patterns as depicted in FIG. 3e. Optionally, in the (first) beam shaping embodiment, the downstream side of the first foil further comprises a diffusor (including optical elements that have a diffusor functionality). FIG. 3f schematically depicts a 3D view of the upstream face of the first foil or the second foil as depicted in FIG. 3c. This is a schematic drawing; dependent upon the type arrangement the facets may be distorted and/or remaining space of the region may be filled with further facets.

FIGS. 4a-4b (and 4c a specific variant) relate to another aspect wherein inhomogeneity is less a problem, but beam shaping and/or directionability is relevant. This embodiment is herein also indicated as second beam shaping embodiment. The first beam shaping embodiment is especially depicted in FIGS. 3a, 3b and 3d. The other figures (other than also 4a-4b) may in general apply to both embodiments, i.e. the first collimating embodiment and the second spot creation embodiment. As will be clear to a person skilled in the art, optical elements (and their geometries) may be chosen to provide, substantial homogenous illumination, collimation or beam spot creating.

Currently each beam shape requires its own beam shaping optics. Our invention uses a single optical element for creating various different beam shapes. Relevant features of these embodiments of the invention is the design of an exit-window that combines two or more beam shape designs at the micro-level in alternating patterns of micro-optics (hereafter called micro-facets), where neighboring micro-facets address different beam shapes. The small étendue that is addressed with micro-facets allows for highly collimated beamlets that can be redirected to a subset of the micro-facets on the exit window. The size of the facets on the exit window is chosen below the resolution of a human eye, when viewed from a typical viewing distance (e.g. one meter) That is, the user cannot identify the individual micro-facets on the exit window under regular operation. Hence the transition between beam-shapes is handled seamlessly. A beam shape design is chosen from the two or more shape designs by laterally shifting an exit window with respect to the other elements of the optical parts of the system.

FIG. 4a shows a ray tracing simulation showing collimated beamlets redirected via two different optical elements on an exit window. The first (bottom) foil redirects the beamlets to a subset of the optical elements on the second (top) foil. The two panels, left and right, demonstrate the two different beam shapes. For this embodiment a two foil approach is preferred. The first foil realizes a more or less focused illumination at the second foil. The function of the second (top) foil is to apply beam shaping. In contrast to the above (first) beam shaping embodiment, wherein the second foil was illuminated in a uniform manner, here non-uniform illumination of the second foil takes place: the second foil is illuminated in an alternating pattern, such as a checkerboard (see FIG. 4a for a ray tracing simulation). More sparse illuminations of the second foil can be applied as well.

FIG. 4a shows a small foil 210, with, by way of example only one combination of light source unit 100, first foil 210 and second foil 220. However, this will be part of a larger structure with a plurality of such combinations (see e.g. FIG. 1a-1b; 2a-2f). Hence, this will be more extended, with a plurality of regions and a plurality of light source units. Here, by way of example only a single light source unit and its corresponding first foil region and second foil region are depicted. The left part and (thus also) the right part of FIG. 4a may thus in a lighting unit comprise a (2D) array of a plurality of light source units, first foil regions and second foil regions, as amongst others also shown in FIGS. 3a-3b. Again, in embodiments each combination of light source unit, first foil region, and second foil regions, is (substantially) identical with respect to geometry and optics. By a shifted position of e.g. the second foil with respect to alignment along a respective normal vector N (see change from left to right configuration in FIG. 4a), the beam (direction) changes. The first foil will in general focus at the second foil.

By changing the alignment of the second foil with respect to the first foil different facets on the second foil are addressed. One can conceive accurate alignment using a threaded design such that via rotation a lateral (and optionally perpendicular) displacement occurs of the second foil with respect to the combination of first foil and the LEDs. In this manner different alignment positions can be obtained. Alternative or even additional to a lateral displacement, also a perpendicular displacement is possible. E.g., one may move along the optical path (or perpendicular to the first foil and/or the second foil), one or more of the light source unit(s), the first foil and the second foil.

As the facet size located on the second foil is in the order of 0.01-50 mm diameter, such as 0.1-5 mm, minimal adjustment is required to switch between facet positions. In this and related embodiments the size of the optical elements on the second foil is typically 1.5 to 100 times larger than the size of the optical elements on the first foil, in the figure the optical elements on the second foil is about 3 times larger than the size of the optical elements on the first foil. The larger the size of the second foil the more space is available per beam shape configuration to redirect the light from the first foil and the more accurate the beam spot definition. Exit windows of spot or down lights are commonly in the order of centimeters exceeding the typical configuration described in the (first) beam shaping embodiment (see FIGS. 3a-3f), where 2 cm diameter (of the exit window) is used. Hence, typically there is sufficient space to apply multiple beam-shape patterns. In a further embodiment the alignment can be adjusted under operation using a piezo-electric actuator. This is made feasible as the neighboring facets can be spaced as close as 0.1 mm. The embodiment described here may e.g. be used for beam shaping with a single optical element in spot or down lights.

FIG. 4b schematically depicts how beam shaping can also be done with the second foil, by using transparent regions 1222A and scattering regions 1222B. Each beam can be addressed to a transparent region 1222A and scattering region 1222B, which form regions or sub regions. Shifting, by translation or rotation may be done by movement of one or more of the second foil, the first foil, or the light source units. An actuator 20 (see FIG. 4c) may move one or more of these. For example, in an embodiment wherein the second foil comprises (micro) lenses the beam spread (degree of collimation) can be controlled when changing the distance between the first and second foil (slightly).

Figure 4C:
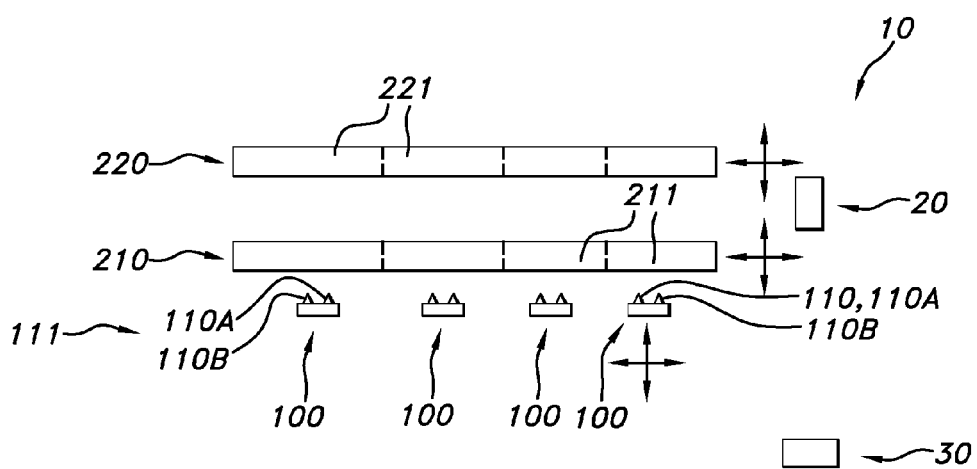

However, it may also be possible that the light source unit 100 comprises two (or more) light sources, which in FIG. 4c are indicated as first light source 110A and second light source 110B, thereby forming a plurality of subsets of a plurality of light sources. A control unit 30 may control the (subsets) of light sources. The control unit 30 may also be configured to control movement of one or more of the above indicated movable items (for those embodiments wherein of the lighting unit items are movable with respect to each other). As will be clear to a person skilled in the art, the actuator and/or the control unit 30, especially control unit 30, may be used in any of the herein described embodiments.

The invention claimed is:

1. A lighting unit, comprising:
   an arrangement of a plurality of light source units configured to emit light;
   a first foil comprising a plurality of transmissive first foil regions, wherein each first foil region comprises a plurality of optical elements comprising an optical element with refractive functionality to the light source unit light in a center of each region and a different optical element with total internal reflection functionality to the light source unit light in a peripheral area remote from said center in each region; and
   a second foil comprising a plurality of transmissive second foil regions, wherein each second foil region comprises a plurality of optical elements wherein each second foil region comprises at its center an optical element with refractive functionality to the light source unit light and in a peripheral area remote from its center a different optical element with total internal reflection functionality to the light source unit light;
   wherein each light source unit has a corresponding first foil region configured downstream of said light source unit and a corresponding second foil region configured downstream of said first foil region.

2. The lighting unit according to claim 1, wherein the center of each region of the first foil and a corresponding light source unit are aligned on a respective normal vector N to the arrangement of plurality of light source units.

3. The lighting unit according to claim 1, wherein the optical elements of the first foil are provided on an upstream side and scattering elements are provided downstream from the upstream side of the first foil, preferably on a downstream side of the first foil.

4. The lighting unit according to claim 1, wherein the optical elements of the first foil are provided on an upstream side and further collimating elements are provided on a downstream side of the first foil.

5. The lighting unit according to claim 1, wherein the light source units have a mean shortest distance and wherein the light source units have a shortest distance to the first foil, wherein $d1/p \leq 0.3$.

6. The lighting unit according to claim 1, wherein the first foil regions are configured to improve homogeneous illumination of the second foil regions with the light source unit light.

7. The lighting unit according to claim 1, wherein the second foil regions are configured to improve collimation of the light source unit light downstream from the first foil.

8. The lighting unit according to claim 1, wherein the first foil is configured to precollimate the light source unit light, and wherein the second foil is configured to further collimate the source unit light downstream from the upstream first foil.

9. The lighting unit according to claim 1, wherein the optical elements on the first foil are focusing elements to provide essentially focalized beams to the second foil.

10. The lighting unit according to claim 1, wherein each first foil region is configured to provide a plurality of beams.

11. The lighting unit according to claim 1, wherein each first foil region comprises a plurality of optical elements having Fresnel functionality.

12. The lighting unit according to claim 1, wherein each of the second foil regions comprises a plurality of optical elements having prismatic shapes, wherein the number of optical elements having prismatic shape per second foil region is n times the number of plurality of beams, wherein n is a natural number equal to or larger than 1.

13. The lighting unit according to claim 1, wherein one or more of the light source units, the first foil, and/or the second foil can be transported in a direction perpendicular to a first arrangement of light source units.

14. The lighting unit according to claim 1, wherein the second foil and a combination of the one or more of the light source units and the first foil can be transported for a change in alignment in a direction parallel to a first arrangement of light source units.

15. The lighting unit according to claim 1, wherein one or more of the light source units comprises at least a first solid state light source and a second solid state light source, and wherein a subset of the first solid state light sources and a subset of the second solid state light sources are individually controllable.

16. A method of using a lighting unit, comprising:
   providing an arrangement of a plurality of light source units configured to emit light;
   disposing a first foil comprising a plurality of transmissive first foil regions, wherein each first foil region comprises a plurality of optical elements comprising an optical element with refractive functionality to the light source unit light in a center of each region and a different optical element with total internal reflection functionality to the light source unit light in a peripheral area remote from said center in each region;
   disposing a second foil comprising a plurality of transmissive second foil regions, wherein each second foil region comprises a plurality of optical elements wherein each second foil region comprises at its center an optical element with refractive functionality to the light source unit light and in a peripheral area remote from its center a different optical element with total internal reflection functionality to the light source unit light;
   configuring each light source unit with a corresponding first foil region downstream of said light source unit and a corresponding second foil region configured downstream of said first foil region; and controlling the shape of a beam of light from the light source unit light of the arrangement of a plurality of light source units.

17. The method according to claim 16, further comprising providing said beam of light having a full width half maximum (FWHM) of less than 20°.

18. The method according to claim 16, controlling one or more of the shape and direction of said beam of light.

* * * * *